United States Patent
Choi et al.

(10) Patent No.: US 11,706,517 B2
(45) Date of Patent: Jul. 18, 2023

(54) VERTICALLY LONG APERTURES FOR COMPUTING DEVICE CAMERAS

(71) Applicant: Google LLC, Mountain View, CA (US)

(72) Inventors: Sangmoo Choi, Palo Alto, CA (US);
Lu Gao, Los Altos, CA (US);
Yoshimichi Matsuoka, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 98 days.

(21) Appl. No.: 17/197,784

(22) Filed: Mar. 10, 2021

(65) Prior Publication Data
US 2022/0294948 A1    Sep. 15, 2022

(51) Int. Cl.
| | | |
|---|---|---|
| *G09G 3/20* | (2006.01) | |
| *H04N 23/57* | (2023.01) | |
| *G09G 3/3208* | (2016.01) | |
| *H04N 23/75* | (2023.01) | |
| *H10K 59/121* | (2023.01) | |

(52) U.S. Cl.
CPC .......... *H04N 23/57* (2023.01); *G09G 3/3208* (2013.01); *H04N 23/75* (2023.01); *H10K 59/121* (2023.02); *G09G 3/20* (2013.01)

(58) Field of Classification Search
CPC .... H04N 5/2257; H04N 5/238; G09G 3/3208; G09G 3/20; H01L 27/326
See application file for complete search history.

(56) References Cited

U.S. PATENT DOCUMENTS

| | | |
|---|---|---|
| 2020/0267293 A1 | 8/2020 | Noh et al. |
| 2020/0348823 A1 | 11/2020 | Cheng |
| 2020/0403186 A1 | 12/2020 | Choi et al. |
| 2021/0018973 A1* | 1/2021 | Lu ............................ G06T 1/60 |
| 2021/0120112 A1* | 4/2021 | Li ........................ G02F 1/13338 |
| 2021/0136291 A1* | 5/2021 | Chu ...................... G06F 1/1686 |
| 2021/0185198 A1* | 6/2021 | Attar ................... H04N 23/698 |
| 2021/0376872 A1* | 12/2021 | Le ........................ H04M 1/0264 |
| 2021/0405447 A1* | 12/2021 | Sun ........................ H04N 23/57 |
| 2021/0408457 A1* | 12/2021 | Fang ................... H01L 27/3258 |

FOREIGN PATENT DOCUMENTS

WO    2020156309 A1    8/2020

OTHER PUBLICATIONS

International Search Report and Written Opinion of International Application No. PCT/US2022/070121, dated Apr. 12, 2022, 11 pp.

(Continued)

*Primary Examiner* — Sejoon Ahn
(74) *Attorney, Agent, or Firm* — Shumaker & Sieffert, P.A.

(57) ABSTRACT

A computing device includes a display panel having a first end and a second end, a sensor, and a processing circuitry. The display panel includes a matrix of pixels and defines an aperture surrounded by pixels of the matrix of pixels but that does not include pixels of the matrix of pixels. A length of the aperture parallel to an axis connecting the first end and the second end is greater than a length of the aperture perpendicular to the axis. The sensor is configured to capture light that passes through the aperture. The processing circuitry, disposed proximal to the second end, is configured to output control signals to pixels of the matrix of pixels.

10 Claims, 6 Drawing Sheets

(56) References Cited

OTHER PUBLICATIONS

Wikipedia, "Image sensor format," last edit made Apr. 4, 2021, retrieved from https://en.wikipedia.org/wiki/Image_sensor_format on Jun. 10, 2021, 19 pp.

Youtube, "Samsung Galaxy S10 and S10 Plus: Howto Hide the Front Camera (Hole)," uploaded by Sakitech, Feb. 25, 2019, retrieved from https://www.youtube.com/watch?v=UVHbVMs-g-g.

Daily Motion, Under display camera technology in Display Selfie Camera , Xiaomi Oppo, Honor, Samsung, video accessed from https://www.dailymotion.com/video/x7rkep0, retrieved Jun. 17, 2021, 2 pp.

* cited by examiner

VERTICALLY LONG APERTURES FOR COMPUTING DEVICE CAMERAS

BACKGROUND

Computing devices such as so-called smartphones, tablets, and the like may include one or more cameras for capturing photographs and videos. An example of such a camera may be a front-facing camera—that is, a camera facing a user of the computing device when the user is looking at a display panel of the computing device. Front-facing cameras may be used to, for example, capture a self-portrait photograph or video. Computing devices may be configured such that the front-facing camera is within a housing and underneath the display panel of the computing device.

In such configurations, a region (usually in the shape of a circle or a "hole-punch") of the display panel may not include components that obstruct light (e.g., light-emitting diodes (LEDs), traces, etc.) in order to define an aperture through which light may pass (e.g., a transparent hole) to reach an image sensor of the front-facing camera. Because the aperture may not include components that obstruct light, such as light emitting elements (e.g., pixels), the active area (i.e., the area that is useful for displaying images) of the display panel may decrease.

SUMMARY

In general, the amount of light that reaches an image sensor may affect the performance of the image sensor and, thus, the camera. Accordingly, display panels may be configured to define apertures large enough to ensure that a sufficient amount of light reaches the image sensors of the front-facing cameras. For instance, because the shape of image sensors is usually rectangular and the shape of apertures is usually circular, display panels may define circular apertures that (when viewed normal to and facing the front-facing camera) have perimeters encompassing the underlying rectangular image sensors such that the image sensors are not optically obstructed by the display panel.

However, display panels may define apertures with dimensions that decrease the active area of the display panel without improving the performance of the front-facing cameras. For example, some of the light passing through an aperture that is large relative to the underlying image sensor may fall somewhere other than the image sensor (i.e., outside the perimeter of the image sensor). Similarly, light passing through an aperture that has a different shape than the image sensor may fall somewhere other than the image sensor. For example, some of the light passing through a circular aperture may fall outside the perimeter of the image sensor.

In general, this disclosure is directed to display panels having reduced-area apertures that enable image sensors of underlying front-facing cameras to receive sufficient light. In accordance with one or more aspects of this disclosure, rather than an aperture having the shape of a circle, the aperture may have an oblong shape in which a length of the aperture parallel to a long axis of the display panel is greater than a length of the aperture perpendicular to the axis. For reasons discussed in greater detail below, such a shape may not only decrease the proportion of the light passing through the aperture that falls somewhere other than the image sensor of the front-facing camera, but may also reduce the size of the aperture and the size of a non-active bezel surrounding the aperture. As a result, the active area of the display panel of the computing device may be increased without compromising the performance of the front-facing camera.

An example computing device includes: a display panel having a first end and a second end, wherein the display panel includes a matrix of pixels and defines an aperture surrounded by pixels of the matrix of pixels but that does not include pixels of the matrix of pixels, and wherein a length of the aperture parallel to an axis connecting the first end and the second end is greater than a length of the aperture perpendicular to the axis; a sensor configured to capture light that passes through the aperture; and a processing circuitry, disposed proximal to the second end, configured to output control signals to pixels of the matrix of pixels.

An example method includes: displaying, at a display panel of a computing device and at a first time, a first image, wherein the display panel has a first end and a second end, wherein the display panel includes a matrix of pixels and defines an aperture surrounded by pixels of the matrix of pixels but that does not include pixels of the matrix of pixels, and wherein a length of a physical shape of the aperture parallel to an axis connecting the first end and the second end is greater than a length of the physical shape of the aperture perpendicular to the axis; displaying, at the display panel and at a second time that is different than the first time, a second image resulting the physical shape of the aperture having a modified apparent shape that is different than the physical shape; and capturing, via a sensor that senses light that passes through the aperture, an image.

An example non-transitory computer-readable storage medium stores instructions that, when executed, cause processing circuitry of a computing device to: display, at a display panel of the computing device and at a first time, a first image, wherein the display panel has a first end and a second end, wherein the display panel includes a matrix of pixels and defines an aperture surrounded by pixels of the matrix of pixels but that does not include pixels of the matrix of pixels, and wherein a length of a physical shape of the aperture parallel to an axis connecting the first end and the second end is greater than a length of the physical shape of the aperture perpendicular to the axis; display, at the display panel and at a second time that is different than the first time, a second image resulting the physical shape of the aperture having a modified apparent shape that is different than the physical shape; and capture, via a sensor that senses light that passes through the aperture, an image.

The details of one or more examples of the disclosure are set forth in the accompanying drawings and the description below. Other features, objects, and advantages will be apparent from the description and drawings, and from the claims.

DETAILED DESCRIPTION

Figure 1:
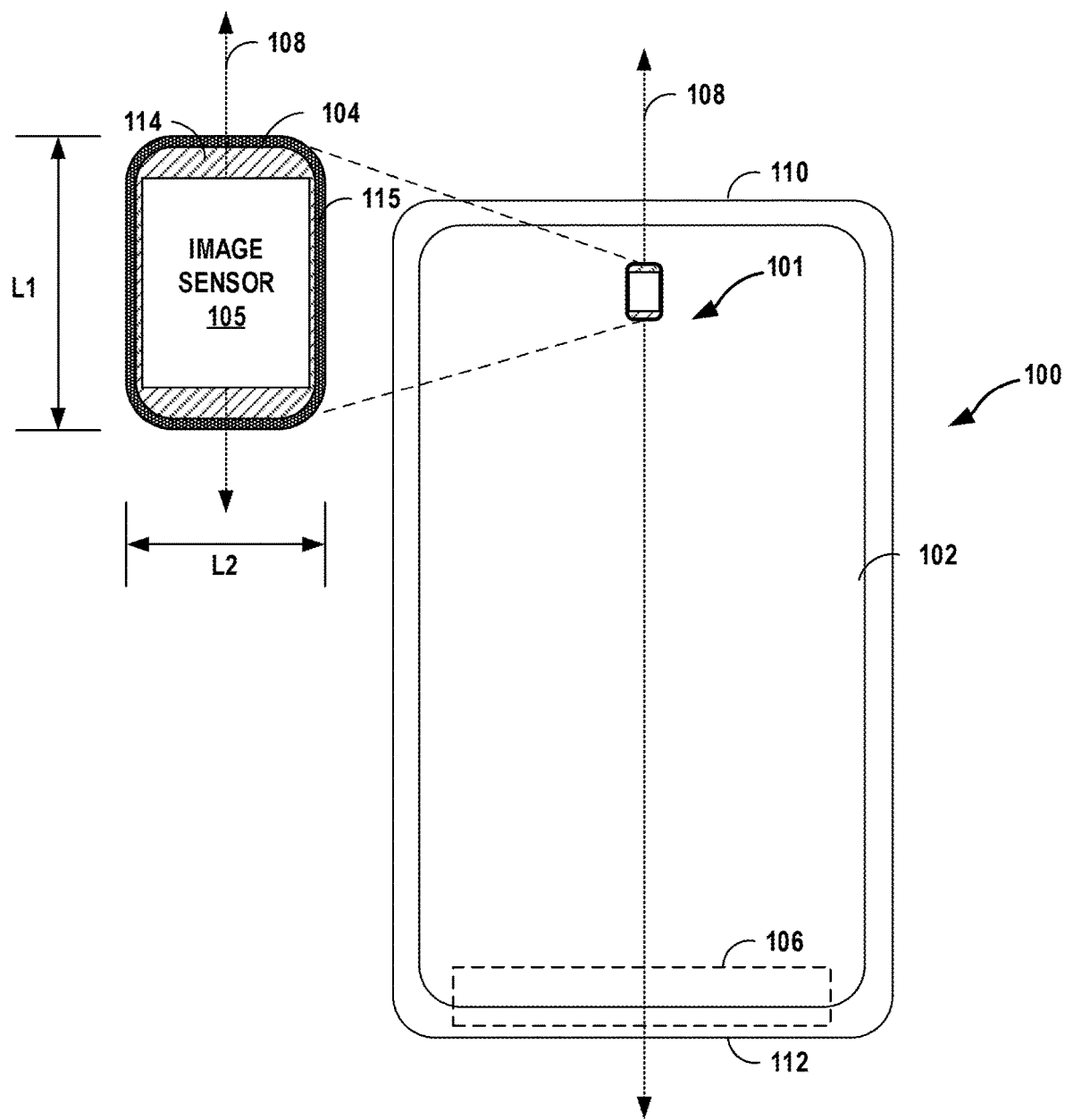
FIG. 1 is a system diagram illustrating an example computing device with a display panel that defines an oblong aperture surrounded by a matrix of pixels, in accordance with one or more aspects of this disclosure.

FIG. 1 is a system diagram illustrating an example computing device 100 with a display panel 102 that defines an oblong aperture 104 ("aperture 104") surrounded by a matrix of pixels, in accordance with one or more aspects of this disclosure. Examples of computing device 100 may include, but are not limited to, a mobile phone (including a so-called "smartphone"), a foldable computing device, smart glasses, a smart watch, a portable speaker (including a portable smart speaker), a laptop computer, a portable gaming system, a wireless gaming system controller, an ambient computing device (including a so-called "smart display"), and the like. As shown in FIG. 1, computing device 100 may include camera 101, display panel 102, and processing circuitry 106.

Display panel 102 may include a first end 110 and a second end 112. First end 110 and second end 112 may be opposite of each other such that an axis 108 connects first end 110 and second end 112. Examples of display panel 102 may include, but are not limited to, liquid crystal displays (LCD), light emitting diode (LED) displays, organic light-emitting diode (OLED) displays, active-matrix organic light emitting diode ("AMOLED") displays, microLED displays, or similar monochrome or color displays capable of outputting visible information to a user of display panel 102. In some examples, display panel 102 may be configured to allow a sensor underneath display panel 102 to operate through display panel via omission of back cover material from an area of a back cover of the display above the sensor. In such an example, display panel 102 may be an OLED display, an AMOLED display, or any other suitable display. Display panel 102 may include light emitting elements arranged as a matrix of pixels.

As shown in FIG. 1, computing device 100 includes processing circuitry 106 within a housing of computing device 100. Processing circuitry 106 may implement functionality and/or execute instructions within computing device 100. For example, processing circuitry 106 configured to output control signals to pixels of display panel 102. Examples of processing circuitry 106 may include a display driver integrated circuit (DDIC), a central processing unit (CPU), a visual processing unit (VPU), a graphics processing unit (GPU), a tensor processing unit (TPU), a neural processing unit (NPU), a neural processing engine, a core of a CPU, VPU, GPU, TPU, NPU or other processing device, an application specific integrated circuit (ASIC), a field programmable gate array (FPGA), a co-processor, a controller, or combinations of the processing devices described above. Processing circuitry 106 may be embedded within other hardware components (e.g., an image sensor, an accelerometer, etc.). Further, computing device 100 may include processing devices in addition to processing circuitry 106, such as another processing circuitry.

Processing circuitry 106 may be located in any portion of device 100. As one example, processing circuitry 106 may be located proximate to second end 112. As noted above, processing circuitry 106 may include a DDIC. In some examples, processing circuitry 112 may be located, at least in part, under another component of device 100, such as display panel 102. In some examples, such as where processing circuitry 106 includes a DDIC, processing circuitry 106 may be connected to display panel 102 via a ribbon cable. As such, processing circuitry 106 may be a DDIC located proximate to second end 112, reside at least partially under display panel 102, and be connected to display panel 102 via a ribbon cable.

Computing device 100 may include one or more cameras configured to capture image data. For example, a camera 101 may be integrated into computing device 100 such that a lens of camera 101 faces a user of computing device 100 when the user is looking at display panel 102. Camera 101 may be referred to as a front-facing camera. Computing device 100 may also include one or more rear-facing cameras (not shown for ease of illustration) facing in a direction generally opposite of camera 101. In general, camera 101 may include a camera body (e.g., defined within computing device 100).

As discussed above, display panel 102 may include a matrix of pixels. The matrix of pixels may be arranged such that display panel 102 defines aperture 104 (e.g., an opening, a transparent window, etc.) where aperture 104 is surrounded by pixels of the matrix of pixels. Display panel 102 may define aperture 104 with length L1 and length L2, where L1 is a length of aperture 104 parallel to axis 108, and L2 is a length of aperture 104 perpendicular to axis 108.

Aperture 104 may be configured to allow light into the camera body of camera 101 to form an image on an image sensor 105 of camera 101. For example, aperture 104 may not include components that obstruct light, such as light emitting elements (e.g., pixels), such that aperture 104 is a transparent region. Because aperture 104 may not include pixels of the matrix of pixels, aperture 104 may be a blind area (i.e., a region without active pixels). In some examples, aperture 104 may be defined proximal to first end 110 of display panel 102. For instance, a centroid of aperture 104 may be closer to first end 110 than second end 112. In some examples, a non-active, non-transparent bezel 115 ("bezel 115") may surround aperture 104. As such, the blind area of display panel 102 may include the area of aperture 104 and the area of bezel 115.

Image sensor 105 of camera 101 may be an electronic image sensor. Image sensor 105 may be configured to detect (e.g., capture) and transmit information used to create an image. For example, image sensor 105 may convert the variable attenuation of light waves (e.g., as the light waves pass through or reflect off aperture 104) into digital signals to be received by processing devices of computing device 100. Examples of image sensor 105 may include a charge-couple device (CCD), a complementary metal-oxide-semiconductor sensor (CMOS sensor), and/or the like. Image sensor 105 may vary in shape and size. As shown in FIG. 1, the shape of image sensor 105 may be rectangular.

A configuration of camera 101 may influence various properties of the light reaching image sensor 105. For example, camera 101 may include lenses configured to focus the light entering camera 101. Similarly, a size of aperture 104 of camera 101 may be increased or decreased to enable more or less light to pass through aperture 104 to reach image sensor 105. The configuration of camera 101 may also dictate a field of view (FOV) of camera 101. FOV may represent the part of a scene that is visible through a camera at a particular position and orientation in space. As such, objects outside FOV when an image is captured may not be recorded in the image. In some examples, the degree of FOV may be affected by the lens, aperture 104, and image sensor 105 of camera 101.

In some examples, aperture 104 may have a size large enough to ensure that the entirety of image sensor 105 (e.g., entirety of an active area of image sensor 105) is not optically obstructed by display panel 102. For instance, display panel 102 may define aperture 104 with a perimeter large enough to encompass image sensor 105 such that the entirety of image sensor 105 is not optically obstructed by display panel 102.

Because aperture 104 may not include light emitting elements (e.g., pixels), an active area (i.e., the area that is useful for displaying images) of display panel 102 may decrease. However, this decrease in the active area may not correspond to improved performance of camera 101 because, depending on the dimensions of aperture 104, some of the light passing through aperture 104 may not reach image sensor 105 of camera 101 but instead fall somewhere other than image sensor 105.

For example, light may fall on a region 114 (illustrated in FIG. 1 as the total area of the shaded regions between the perimeter of aperture 104 and the perimeter of image sensor 105). As such, region 114 may represent a portion of aperture 104 that is a blind area but that does not contribute to the performance of camera 101. Thus, reducing the area of region 114 may advantageously enable the repopulation of pixels of display panel 102, increasing the active area of the display panel without comprising the performance of camera 101.

In accordance with one or more aspects of this disclosure, a display panel (e.g., display panel 102) of a computing device (e.g., computing device 100) may define a reduced-area aperture (e.g., relative to a circular aperture) while enabling sufficient light to fall on an image sensor (e.g., image sensor 105). For example, rather than display panel 102 defining aperture 104 with the shape of a circle, display panel 102 may define a reduced-area aperture with an oblong shape that, compared to a circle, more closely resembles the size, shape, orientation, and/or the like of image sensor 105, allowing for an area of aperture 104 to be reduced without affecting the performance of camera 101. Further, L1 of the reduced-area aperture may be greater than L2 of the reduced-area aperture, which (as discussed in greater detail with respect to FIGS. 3A-3B) may decrease bezel thickness and, in turn, further decrease the blind area of computing device 100.

For example, as shown in the example of FIG. 1, aperture 104 has the shape of a rectangle with rounded corners. The shape of aperture 104 may be more similar to image sensor 105 than a circle such that a perimeter of aperture 104 more closely contours around image sensor 105 than a perimeter of a circular aperture. As described above, aperture 104 may be defined by display panel 102 to ensure that that the entirety of image sensor 105 is not optically obstructed by display panel 102. However, compared to a circular aperture, aperture 104 may have a smaller area (due to there being less separation between the perimeter of aperture 104 and the perimeter of image sensor 105), potentially allowing for a reduction in the blind area of display panel 102. In particular, by using aperture 104 with the shape of a rectangle with rounded corners instead of a circular aperture, the area of region 114 may be decreased, potentially allowing for the repopulation of pixels and increasing the active area of display panel 102.

Other shapes for a reduced-area aperture are contemplated by this disclosure. For example, a reduced-area aperture may have a shape of a rectangle, an ellipse, a discorectangle, or any other oblong shape. In any case, L1 of the reduced-area aperture (e.g., aperture 104) may be greater than L2 of the reduced-area aperture in order to reduce bezel thickness, thereby further decreasing the blind area of display panel 102. Similarly, image sensor 105 may have the same orientation as the reduced-area aperture in order to reduce the blind area. That is, like the reduced-area aperture, a length of image sensor 105 parallel to axis 108 may be greater than a length of image sensor 105 perpendicular to axis 108. In this way, the reduced-area aperture may more closely contour around a perimeter of image sensor 105, reducing the area of the region representing the proportion of the light that does not reach image sensor 105 (e.g., region 114A).

Figure 2:
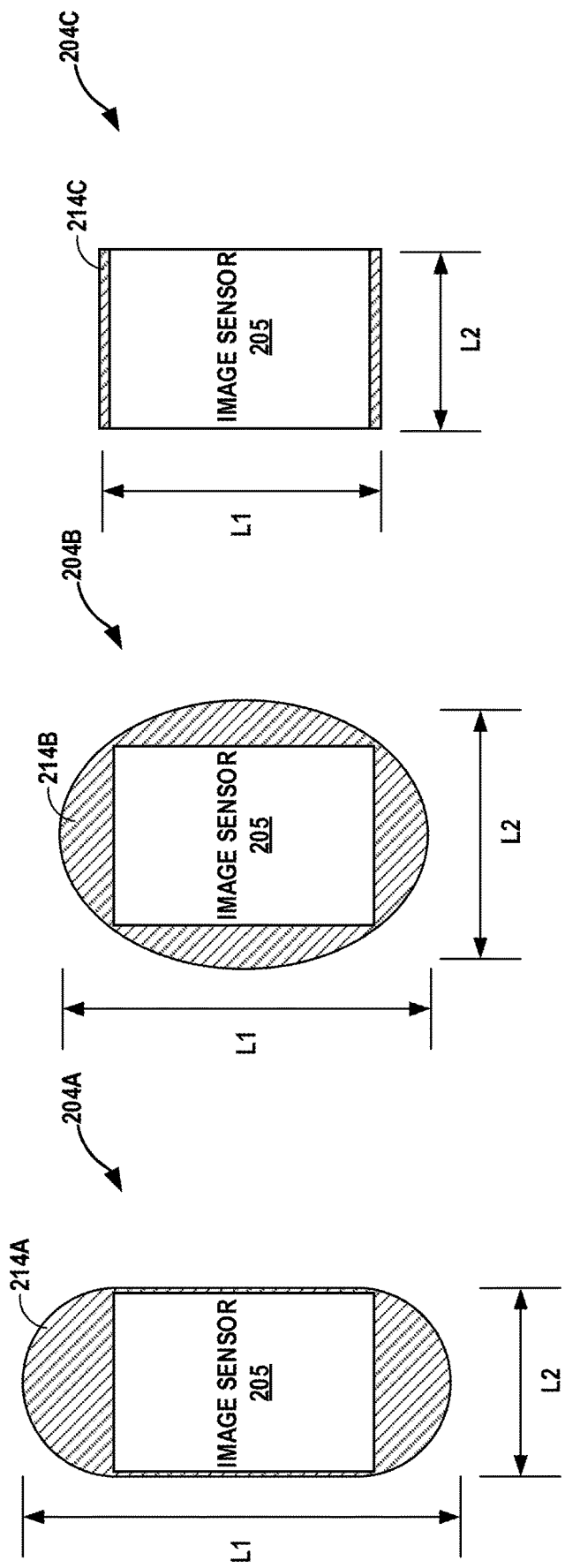
FIGS. 2A-2C are conceptual diagrams illustrating various example shapes of an aperture of a computing device, in accordance with one or more aspects of this disclosure.

FIGS. 2A-2C are conceptual diagrams illustrating various example apertures 204A-204C (collectively, apertures 204") of the computing device, in accordance with one or more techniques of this disclosure. Each of apertures 204 (e.g., apertures 204A-C) is one example of aperture 104 shown in FIG. 1. Although only a few shapes of apertures 204 are illustrated herein, it should be understood that other oblong shapes, including rectangles with rounded corners, are contemplated. As shown in FIGS. 2A-2C, apertures 204 may have a size large enough that the perimeter of each encompasses the entirety of (an active area of) an image sensor 205 such that the entirety of image sensor 205 is not optically obstructed by a display panel (e.g., display panel 102). Image sensor 205 is one example of image sensor 105 shown in FIG. 1. As such, the shape, size orientation, and/or the like of image sensor 205 may be the same as those of image sensor 105. In some examples, an aspect ratio of image sensor 205 may be 4:3, 3:2, 1.85:1, or the like.

As shown in FIG. 2A, light may pass through an aperture 204A in the shape of a discorectangle with a L1 greater than a L2 to reach an image sensor 205. Aperture 204A may have a size large enough that the perimeter of aperture 204A encompasses the entirety of image sensor 205 such that the entirety of image sensor 205 is not optically obstructed (e.g., by display panel 102). As shown in the example of FIG. 2A, image sensor 205 may receive only a proportion of the light passing through aperture 204A such that the remainder of the light falls elsewhere. The proportion of the light that does not reach image sensor 205 may be represented by a region 214A (which is one example of region 114 shown in FIG. 1) of aperture 204A. Region 214A may be smaller than a region between the perimeter of a circular aperture and the perimeter of an image sensor (e.g., image sensor 205) encompassed by the circular aperture, potentially allowing for the repopulation of pixels in the area near aperture 204A and increasing the active area of the display panel (e.g., display panel 102).

As shown in FIG. 2B, light may pass through an aperture 204B in the shape of an ellipse with a L1 greater than a L2 to reach image sensor 205. Aperture 204B may have a size large enough that the perimeter of aperture 204B encompasses the entirety of image sensor 205 such that the entirety of image sensor 205 is not optically obstructed (e.g., by display panel 102). As shown in the example of FIG. 2B, image sensor 205 may receive only a proportion of the light passing through aperture 204B such that the remainder of the light falls elsewhere. The proportion of the light that does not reach image sensor 205 may be represented by a region 214B (which is one example of region 114 shown in FIG. 1) of aperture 204B. Region 214B may be smaller than a region between the perimeter of a circular aperture and the perimeter of an image sensor (e.g., image sensor 205) encompassed by the circular aperture, potentially allowing for the repopulation of pixels in the area near aperture 204B and increasing the active area of the display panel (e.g., display panel 102).

As shown in FIG. 2C, light may pass through an aperture 204C in the shape of a rectangle with a L1 greater than a L2 to reach image sensor 205. Aperture 204C may have a size large enough that the perimeter of aperture 204C encompasses the entirety of image sensor 205. Alternatively, as shown in FIG. 2C, aperture 204C may be larger. In either case, image sensor may not be optically obstructed (e.g., by display panel 102). As shown in the example of FIG. 2C, image sensor 205 may receive only a proportion of the light passing through aperture 204C such that the remainder of the light falls elsewhere. The proportion of the light that does not reach image sensor 205 may be represented by a region 214C (which is one example of region 114 shown in FIG. 1) of aperture 204C. Region 214C may be smaller than a region between the perimeter of a circular aperture and the perimeter of an image sensor (e.g., image sensor 205) encompassed by the circular aperture, potentially allowing for the repopulation of pixels in the area near aperture 204C and increasing the active area of the display panel (e.g., display panel 102).

As shown by FIGS. 2A-2C, the area of the regions 214 representing the proportion of the light that does not reach image sensor 205 may be reduced by making the size, shape, orientation, and/or the like of apertures 204 more similar to those of image sensor 205 such that apertures 204 (e.g., relative to aperture 104) more closely contour around a perimeter of image sensor 205. For example, a circular aperture may have relatively large separation between a perimeter of the circular aperture and a perimeter of an image sensor (e.g., image sensor 205) and thus a relatively large region therebetween. On the other hand, as shown in the example of FIG. 2C, aperture 204C having a shape of a rectangle may result in relatively small separation between a perimeter of aperture 204C and a perimeter of image sensor 205, and thus a relatively small region 214C.

In some examples, a computing device (e.g., computing device 100) may include, in addition to a first processing circuitry (e.g., processing circuitry 106) configured to output control signals to pixels of the matrix of pixel, a second processing circuitry configured to control operation of the first processing circuitry such that pixels of the matrix of pixels surrounding apertures 204 are selectively deactivated to modify an appearance of a shape of apertures 204. For example, even if display panel 102 of computing device 100 defines aperture 204C such that the shape of aperture 204C is a rectangle, the second processing circuitry may control operation of processing circuitry 112 to deactivate pixels surrounding aperture 204C to make the shape of aperture 204C appear, to the user of computing device 100, to be a circle similar to aperture 104, a rectangle with rounded corners similar to aperture 104, a discorectangle similar to aperture 204A, an ellipse similar to aperture 204B, a square, or the like.

It is understood by those skilled in the art that, due to techniques used to route traces, when processing circuitry configured to output control signals to pixels of the matrix of pixels (e.g., processing circuitry 106) is disposed proximal to a second end (e.g., second end 112) of a computing device (e.g., computing device 100), the length of an aperture (e.g., apertures 104, apertures 204, etc.) parallel to an axis (e.g., axis 108) connecting a first end (e.g., first end 110) and the second end of the computing device (i.e., L1) may not affect bezel thickness, but that the length of the aperture perpendicular to the axis (i.e., L2) may increase bezel thickness. Accordingly, if a first length of the aperture is greater than a second length of the aperture, orienting the aperture such that the first length is perpendicular to the axis may increase the thickness of the bezel surrounding the aperture, increasing the blind area of the display panel.

Figure 3:
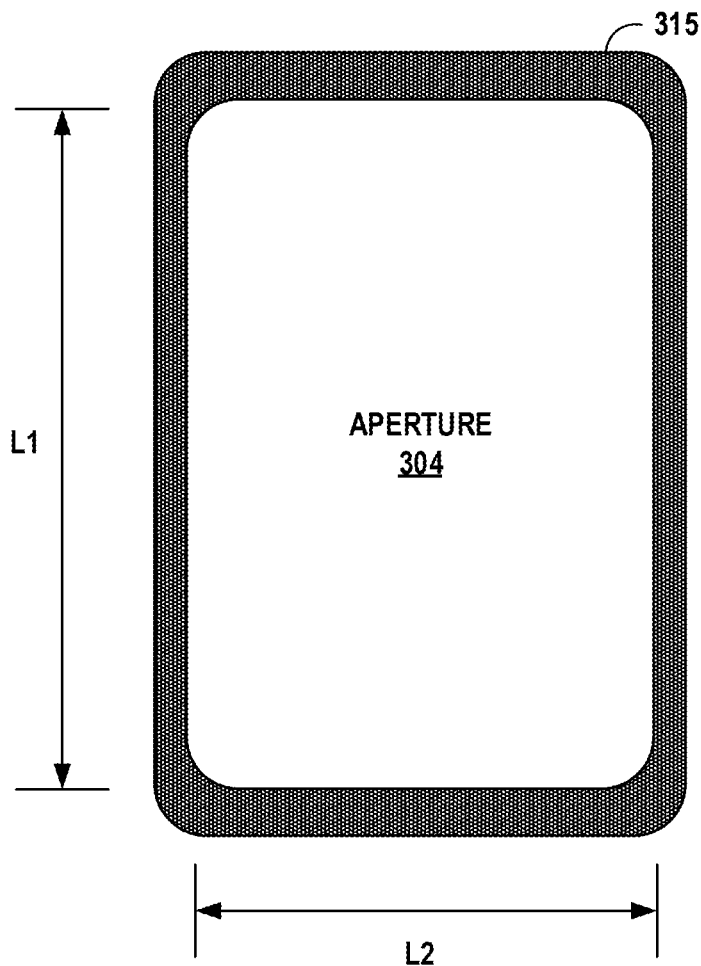
FIG. 3 is a conceptual diagram illustrating an example bezel surrounding an aperture of a computing device.

FIG. 3 is a conceptual diagram illustrating an example bezel 315 (which is one example of bezel 115 shown in FIG. 1) surrounding aperture 304 of a computing device (e.g., computing device 100). As shown in FIG. 3, aperture 304 may be surrounded by a region that represents bezel 315. Aperture 304 is one example of aperture 104 shown in FIG. 1. As such, aperture 104 may be in the shape of a rectangle with rounded corners with a L1 greater than a L2.

The orientation of aperture 304 may result in reduced thickness of bezel 315. For example, if, instead of the orientation of aperture 304 shown in FIG. 3, aperture 304 is oriented on a display panel (e.g., display panel 102) such that L2 is greater than L1 (e.g., aperture 304 is rotated by 90°), the thickness of bezel 315 may be increased (relative to the thickness of bezel 315 shown in FIG. 3).

In examples where a first length of aperture 304 is greater than a second length of aperture 304, aperture 304 may be oriented such that the first length of aperture 304 is parallel to an axis (e.g., axis 108) connecting a first end (e.g., first end 110) and the second end of the computing device (e.g., computing device 100, and such that the second length of aperture is perpendicular to the axis. In other words, aperture 304 may be oriented such that the (longer) first length of aperture 304 is L1, and the (shorter) second length of aperture 304 is L2, making L1 greater than L2. As a result, the thickness of bezels 315 surrounding apertures 304 may be reduced, or at least an increase in the thickness of bezels 315 (due to another orientation of aperture 304) may be avoided. Thus, pixels may be repopulated in the area near bezels 315, potentially increasing the active area of the display panel (e.g., display panel 102).

Figure 4:
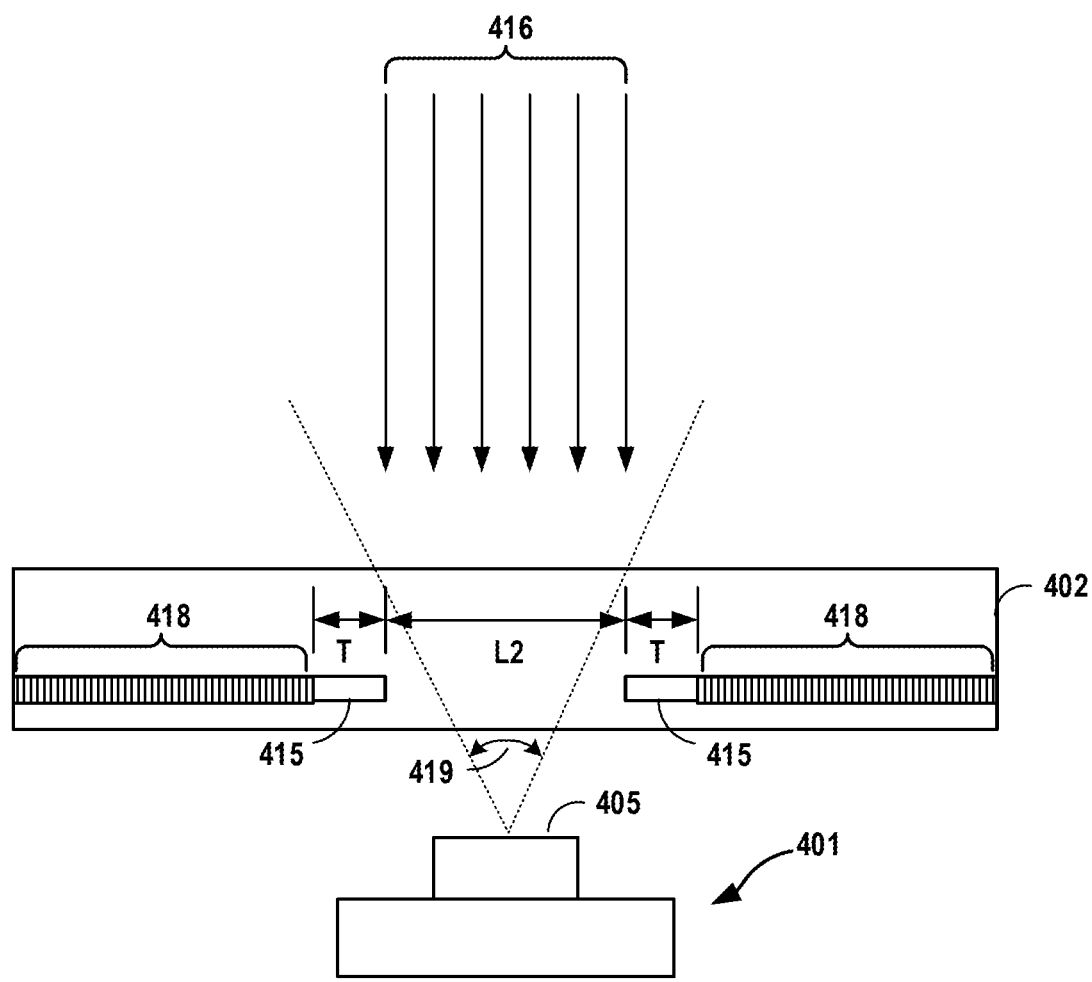
FIG. 4 is a system diagram illustrating a field of view of an example front-facing camera of a computing device, in accordance with one or more aspects of this disclosure.

FIG. 4 is a system diagram illustrating a FOV of a camera 401 through a display panel 402 of a computing device 400, in accordance with one or more aspects of this disclosure. Computing device 400 is one example of computing device 100 shown in FIG. 1. Camera 401 is one example of camera 101 shown in FIG. 1. Display panel 402 is one example of display panel 102 shown in FIG. 1. As shown in FIG. 4, display panel 402 may include a matrix of pixels 418 (which are not transparent). Matrix of pixels 418 may define an aperture 404 (which is one example of aperture 104 shown in FIG. 1) with length L1 and length L2. For example, aperture 404 may be surrounded by pixels of matrix of pixels 418. At the same time, aperture 404 may not include pixels of matrix of pixels 418. Furthermore, matrix of pixels 418 may define a bezel 415 (which is one example of bezel 115 shown in FIG. 1) surrounding aperture 404. The bezel may be non-active and non-transparent. Bezel 415 may have a thickness T.

Light waves 416 may pass through aperture 404, which is configured to be transparent, to reach image sensor 405 of camera 401. As shown in FIG. 4, aperture 404 may be defined such the perimeter of aperture 404 encompasses the entirety of an image sensor 405 (which is one example of image sensor 105 shown in FIG. 1) such that the entirety of image sensor 405 is not optically obstructed by display panel 402. That is, a first proportion of light waves 416 may reach any part of the active area of image sensor 405. However, as also shown in FIG. 4, a second proportion of light waves 416 may fall somewhere other than image sensor 405.

As described above, the configuration of camera 401 may determine a FOV 419 of camera 401. FOV 419 may represent the part of a scene that is visible through a camera at a particular position and orientation in space. As such, objects outside FOV 419 when an image is captured may not be recorded in the image. In some examples, the degree of FOV 419 may be affected by the lens, aperture 404, and image sensor 405 of camera 401.

In some examples, aperture 404 may be defined such that display panel 402 does not optically obstruct FOV 419. For example, as shown in FIG. 4, L2 of aperture 404 may be sufficiently long such that neither bezel 415 nor matrix of pixels 418 obstructs FOV 419. Although not shown in FIG. 4, it should be understood that L1, or any other length, of aperture 404 may also be sufficiently long such that neither bezel nor matrix of pixels 418 optically obstructs FOV 419.

However, at some point, the size of aperture 404 does not affect FOV 419 (e.g., determine whether FOV 419 is obstructed by bezel 415 or matrix of pixels). For example, as shown in FIG. 4, L2 of aperture 404 may be wider than the maximum degree of FOV 419 of camera 401. Thus, while lengths (e.g., L1, L2, etc.) of aperture 404 may generally affect FOV 419, in some examples, increasing the size of aperture 404 may increase the blind area of display panel 402 without increasing FOV 419.

Because aperture 404 may be the only transparent region of display panel 402, aperture 404 may be surrounded by a non-transparent region that obstructs FOV 419. Moreover, it may be irrelevant whether the non-transparent region surrounding aperture 404 is bezel 415 or matrix of pixels 418 because the obstruction of FOV 419 may be the same in either case. As such, in examples where bezel 415 surrounds (transparent) aperture 404, the thickness of bezel 415 may not increase or decrease FOV 419 (in contrast to the size of aperture 404, which, in some examples, can increase or decrease FOV 419). However, the thickness of bezel 415 may still affect the blind area of display panel 402 because bezel 415 may be non-active. As described above, defining aperture 404 such that L1 of aperture 404 is greater than L2 of aperture 404 may decrease the thickness of bezel 415, potentially allowing for the repopulation of pixels near bezel 415.

Figure 5:
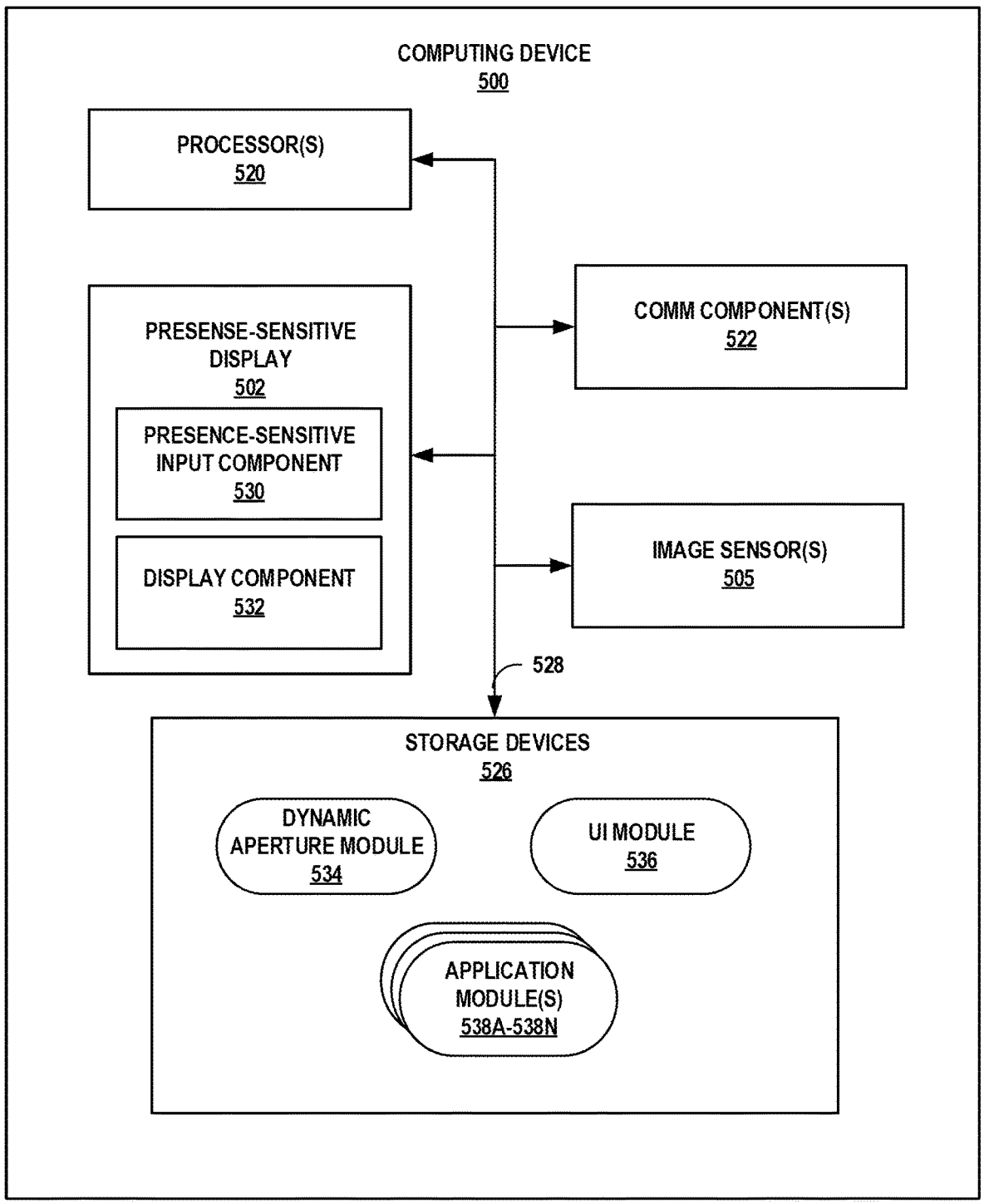
FIG. 5 is a block diagram illustrating, in greater detail, the computing device of FIG. 1.

FIG. 5 is a block diagram illustrating an example of the computing device of FIG. 1 in more detail. Computing device 500 shown in the example of FIG. 5 is one example of computing device 100 shown in FIG. 1. As shown in the example of FIG. 5, computing device 500 includes presence-sensitive display 502 (which may be an example of display panel 102 shown in FIG. 1), one or more processors 520, one or more communication ("COMM") components 522, one or more image sensors 505 (each of which is one example of image sensor 105), and one or more storage devices 526. As shown in FIG. 5, storage devices 526 may include dynamic aperture module 534, user interface (UI) module 536, and application modules 538A-538N (collectively, "application modules 538).

Communication channels 528 may interconnect each of the components 502, 505, 520, 522, and/or 526 for inter-component communications (physically, communicatively, and/or operatively) and thereby allow components 502, 505, 520, 522, and 526 to communicate with one another. In some examples, communication channels 528 may include a system bus, a network connection, one or more inter-process communication data structures, or any other components for communicating data (also referred to as information). Although shown as including components 502, 505, 520, 522, and 526, computing device 500 may include other components or less components than those shown, where such components may be included in other control units such as a telematic control unit (TCU).

One or more COMM components 522 of computing device 500 may communicate with external devices by transmitting and/or receiving data. For example, computing device 500 may use one or more of COMM components 522 to transmit and/or receive radio signals on a radio network such as a cellular radio network. In some examples, COMM components 522 may transmit and/or receive satellite signals on a satellite network such as a Global Positioning System (GPS) network. Examples of COMM components 522 include a network interface card (such as an Ethernet card), an optical transceiver, a radio frequency transceiver, a GPS receiver, or any other type of device that can send and/or receive information. Other examples of COMM components 522 may include short wave radios (e.g., Near Field Communication (NFC), Bluetooth® (including Bluetooth Low Energy (BLE)), GPS, 3G, 4G, 5G, and WiFi® radios found in mobile devices as well as Universal Serial Bus (USB) controllers and the like.

In some examples, presence-sensitive display 502 of computing device 500 may include functionality of an input component and/or an output component. In the example of FIG. 5, presence-sensitive display 502 may include a presence-sensitive input (PSI) component 530 ("PSI component 530"), such as a presence-sensitive screen or touch-sensitive screen. In some examples, PSI component 530 may detect an object at and/or near PSI component 530. As one example range, PSI component 530 may detect an object, such as a finger or stylus that is within two inches or less of PSI component 530. PSI component 530 may determine a location (e.g., an (x,y) coordinate) of PSI component 530 at which the object was detected. In another example range, PSI component 530 may detect an object two inches or less from PSI component 530 and other ranges are also possible. PSI component 530 may determine the location of PSI component 530 selected by a user's finger using capacitive, inductive, and/or optical recognition techniques.

In some examples, presence-sensitive display 502 may also provide output to a user using tactile, audio, or video stimuli. For instance, presence-sensitive display 502 may include display component 532 that displays a graphical user interface. Display component 532 may be any type of output component that provides visual output. While illustrated as an integrated component of computing device 500, presence-sensitive display 502 may, in some examples, be an external component that shares a data or information path with other components of computing device 500 for transmitting and/or receiving input and output. For instance, presence-sensitive display 502 may be a built-in component of computing device 500 located within and physically connected to the external packaging of computing device 500. In another example, presence-sensitive display 502 may be an external component of computing device 500 located outside and physically separated from the packaging of computing device 500. In some examples, presence-sensitive display 502, when located outside of and physically separated from the packaging of computing device 500, may be implemented by two separate components: a presence-sensitive input component 530 for receiving input and a display component 532 for providing output.

Similar to display panel 102 of FIG. 1, presence-sensitive display 502 may define an aperture via-which one or more of image sensors 505 may receive light. In some examples, the aperture defined by presence-sensitive display 502 may have an oblong shape. For instance, a length of a physical shape of the aperture parallel to an axis connecting a first end of presence-sensitive display 502 and a second end of presence-sensitive display 502 (L1) may be greater than a length of the physical shape of the aperture perpendicular to the axis (L2). As discussed above, processing circuitry (e.g., which may be included in processors 520), may be located proximate to the second end.

One or more storage devices 526 within computing device 500 may store information for processing during operation of computing device 500 (e.g., computing device 500 may store data accessed by a dynamic aperture module 534 during execution at computing device 500). In some examples, storage device 526 is a temporary memory, meaning that a primary purpose of storage device 526 is not long-term storage. Storage devices 526 on computing device 500 may be configured for short-term storage of information as volatile memory and therefore not retain stored contents if powered off. Examples of volatile memories include random access memories (RAM), dynamic random access memories (DRAM), static random access memories (SRAM), and other forms of volatile memories known in the art.

Storage devices 526, in some examples, also include one or more computer-readable storage media. Storage devices 526 in some examples include one or more non-transitory computer-readable storage mediums. Storage devices 526 may be configured to store larger amounts of information than typically stored by volatile memory. Storage devices 526 may further be configured for long-term storage of information as non-volatile memory space and retain information after power on/off cycles. Examples of non-volatile memories include magnetic hard discs, optical discs, flash memories, or forms of electrically programmable memories (EPROM) or electrically erasable and programmable (EEPROM) memories. Storage devices 526 may store program instructions and/or information (e.g., data) associated with dynamic aperture module 534. Storage devices 526 may include a memory configured to store data or other information associated with dynamic aperture module 534.

One or more processors 520 may implement functionality and/or execute instructions associated with computing device 500. Examples of processors 520 include application processors, display controllers, auxiliary processors, one or more sensor hubs, and any other hardware configure to function as a processor, a processing unit, or a processing device. Dynamic aperture module 534 may be operable (or executed) by processors 520 to perform various actions, operations, or functions of computing device 500. For example, dynamic aperture module 534 may form executable bytecode that, when executed, cause processors 520 to perform specific operations in accordance with various aspects of the techniques described herein. In another example, processors 520 of computing device 500 may retrieve and execute instructions stored by storage devices 526 that cause processors 520 to perform the operations described herein that are attributed to dynamic aperture module 534, UI module 536, and/or application modules 538. The instructions, when executed by processors 520, may cause computing device 500 to store information within storage devices 526.

In some examples, processors 520 may include a first processing circuitry (e.g., processing circuitry 112) disposed proximal to the second end of presence-sensitive display 502. The first processing circuitry may be configured to output control signals to pixels of the matrix of pixels of display panel 102. In some examples, the first processing circuitry may be a DDIC. Processors 520 may further include a second processing circuitry configured to control operation of the first processing circuitry such that pixels of the matrix of pixels surrounding aperture 204C are selectively deactivated to modify an appearance of a shape of aperture 204C. In some examples, the second processing circuitry may include one or both of a central processing unit (CPU) or a graphical processing unit (GPU).

One or more image sensors 505 may be configured to detect (e.g., capture) and transmit information used to create an image. For example, the image sensors may convert the variable attenuation of light waves (e.g., as the light waves pass through or reflect off objects) into digital signals to be received by processors 520 of computing device 500. Examples of image sensors may include a charge-couple device (CCD) and an active-pixel sensor (CMOS sensor). Image sensors 505 may vary in shape and size but are usually rectangular. Similarly, the aspect ratio of image sensors 505 may vary, although common aspect ratios may be 4:3, 3:2, 1.85:1, and/or the like. The format of image sensors 505 may determine the FOV of a particular lens when used with a particular image sensor.

UI module 536 may be executable to control interface between a user and computing device 500. For instance, UI module 536 may process input (e.g., received via presence-sensitive input component 530, image sensors 505, or other input components) and/or facilitate output of information (e.g., produce or render graphical user interfaces for display at display component 532 or other output components).

Application modules 538 may provide graphical information and instructions to UI module 536 that UI module 536 includes as content or information contained in a graphical representation. For example, application module 536 may be a photography application that executes at computing device 500 to enable a user of computing device 500 to capture, view, and/or edit photos, videos, or other images.

As discussed above, presence-sensitive display 502 may define an aperture via—which a sensor of image sensors 505 receives light. In some examples, it may be desirable for a shape of the aperture to be different at different times. For instance, while a physical shape (e.g., an actual region of display component 532 that does not include light emitting elements) of the aperture may be oblong, in certain scenarios, it may be desirable for the aperture to have a round or non-oblong appearance.

In accordance with one or more aspects of this disclosure, dynamic aperture module 534 may modify an apparent shape of the aperture (e.g., aperture 204C) such that the aperture appears to have different shapes at different times. For example, dynamic aperture module 534 may selectively deactivate, by processors 520, pixels of the matrix of pixels surrounding the aperture, which may have a physical shape of a rectangle, to modify an appearance of the size, shape, orientation, and/or the like of the aperture. Responsive to deactivation of the pixels of the matrix of pixels surrounding aperture 204C, the aperture may now appear to be different (e.g., have a modified apparent shape). For example, the shape of the aperture (i.e., the appearance of aperture 204C following selective deactivation of the pixels of the matrix of pixels surrounding aperture 204C) may appear to be a circle, a discorectangle, an ellipse, a square, or any other shape and/or size. In this way, dynamic aperture module 534 may increase a visual appeal of the aperture to a user of computing device 500.

In some examples, dynamic aperture module 534 may gradually modify the appearance of the shape of the aperture such that the appearance of the shape of the aperture visibly transitions from a first shape to a second shape. For example, dynamic aperture module 534 may gradually modify the appearance of the aperture such that the appearance of the shape of the aperture visibly transitions from a rectangle to an ellipse. As such, dynamic aperture module 534 may effectively cross-fade between different apparent shapes of the aperture Dynamic aperture module 534 may receive user input to determine the modification to the aperture. For example, a user of computing device 500 may provide input via PSI component 530 to select a graphical element displayed by presence-sensitive display 502 associated with modifying an appearance of a shape of aperture 204C to a particular shape (e.g., a circle). Responsive to selection of selection of the graphical element, dynamic aperture module 534 may modify the appearance of the shape of aperture 204C such that the shape of aperture 204C appears to be the particular shape (e.g., a circle). Similarly, a user of computing device 500 may provide another input (e.g., via PSI component 520) to activate the selectively deactivated pixels surrounding the aperture.

Modules 534, 536, 538 may perform operations described herein using software, hardware, firmware, or a mixture of hardware, software, and/or firmware residing in and/or executing at computing device 500. Computing device 500 may execute modules 534, 536, 538 with one or more processors located within a housing of computing device 500. In some examples, computing device 500 may execute modules 534, 536, 538 as one or more virtual machines executing on underlying hardware of computing device 500 located within the housing of computing device 500. Modules 534, 536, 538 may execute as one or more services or components of operating systems or computing platforms of computing device 500. Modules 534, 536, 538 may execute as one or more executable programs at application layers of computing platforms of computing device 500.

Figure 6:
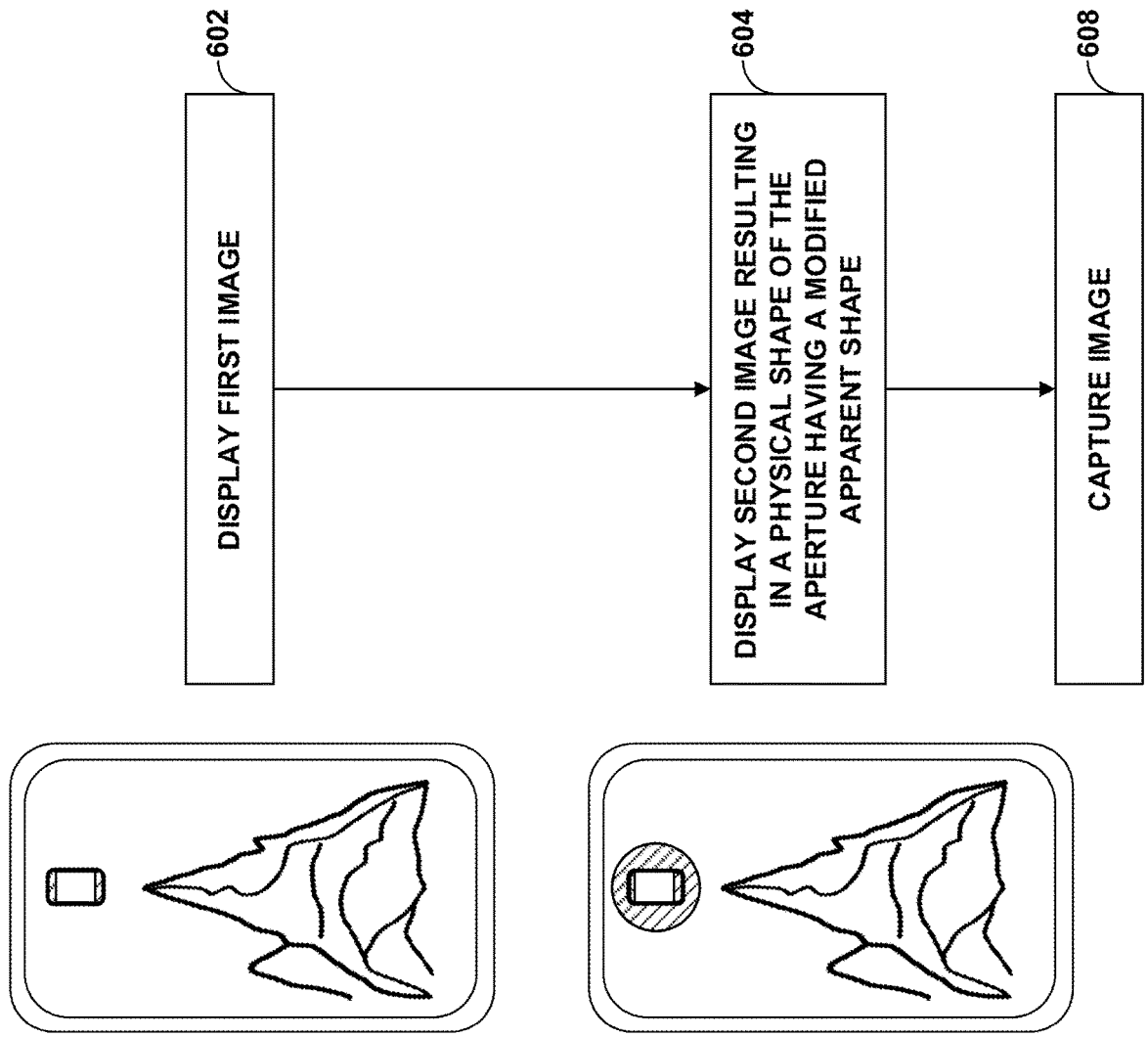
FIG. 6 is a flowchart illustrating an example method of operating a computing device with an aperture to modify a shape of the aperture, in accordance with one or more techniques of this disclosure.

FIG. 6 is a flowchart illustrating an example method of adjusting an apparent shape of an aperture, in accordance with one or more techniques of this disclosure. For purposes of explanation, the technique of FIG. 6 is described in the context of computing device 500 of FIG. 5. However, it should be understood that the method of FIG. 6 may be performed by other examples of computing devices as described herein.

Computing device 500 may display a first image (602). For instance, at a first time, a photography application module of application modules 538 may cause UI module 536 to render a graphical user interface (GUI) that includes a photograph (e.g., of a mountain in FIG. 6). UI module 536 may cause presence-sensitive display 502 to output the GUI. For instance, UI module 536 may output signals to a DDIC (e.g., a column driver IC) that controls at least a portion of display component 532 of presence-sensitive display 502 and the DDIC may cause pixels of display component 532 to form the image.

As discussed above, display component 532 may include a matrix of pixels (e.g., matrix of pixels 418). The matrix of pixels may be arranged such that display component 532 defines an aperture that is surrounded by pixels of the matrix of pixels but does not include pixels of matrix of pixels. Display component 532 may include a first end and a second end (that are opposite of each other such that an axis connects the first end and the second end of presence-sensitive display panel 502.

Computing device 500 may display a second image resulting in a physical shape of the aperture having a modified apparent shape that is different than the physical shape (604). For instance, at a second time that is different than the first time, dynamic aperture module 534 may cause UI module 536 to modify the rendered GUI to adjust an appearance of a shape of the aperture. As one example, UI module 536 may deactivate (e.g., cause the DDIC to deactivate and/or drive to a zero value) pixels of the matrix of pixels proximate to the aperture such that the physical shape of the aperture has the modified apparent shape. As shown in the example of FIG. 6, computing device 500 may modify an aperture that has a physical shape of a rounded rectangle to have a modified apparent shape of a circle.

Computing device 500 may modify the aperture to any desired shape. Example modified apparent shapes include, but are not necessarily limited to, circles, discorectangles, ellipses, or rectangles. In some examples, the modified apparent shape of the aperture may still be surrounded by pixels of the matrix of pixels that are not deactivated. For instance, pixels of the matrix of pixels that computing device 500 uses to form the modified apparent shape of the aperture may not be border or edge pixels of display component 532.

In some examples, dynamic aperture module 534 may gradually modify the appearance of the shape of the aperture such that the appearance of the shape of the aperture visibly transitions from a first shape to a second shape. For example, dynamic aperture module 534 may gradually modify the appearance of the aperture such that the appearance of the shape of the aperture visibly transitions (e.g., cross-fades) from a rectangle to an ellipse.

Dynamic aperture module 534 may receive user input to determine the modification to the aperture. For example, a user of computing device 500 may provide input via PSI component 530 to select a graphical element displayed by presence-sensitive display 502 associated with modifying an appearance of a shape of the aperture to a particular shape (e.g., a circle). Responsive to selection of selection of the graphical element, dynamic aperture module 534 may modify the appearance of the shape of the aperture such that the shape of aperture 204C appears to be the particular shape (e.g., a circle). In this way, the apparent shape of the aperture may be user-selectable.

Computing device 500 may capture an image via a sensor that senses light that passes through the aperture (608). For instance, an image sensor of image sensor 505 may transduce light that passed through the aperture into data, which may be received by UI module 536 and/or the photography application of application modules 538.

The following numbered examples may illustrate one or more aspects of the disclosure:

Example 1: A computing device includes a display panel having a first end and a second end, wherein the display panel includes a matrix of pixels and defines an aperture surrounded by pixels of the matrix of pixels but that does not include pixels of the matrix of pixels, and wherein a length of the aperture parallel to an axis connecting the first end and the second end is greater than a length of the aperture perpendicular to the axis; a sensor configured to capture light that passes through the aperture; and a processing circuitry, disposed proximal to the second end, configured to output control signals to pixels of the matrix of pixels.

Example 2: The computing device of example 1, wherein the display panel defines the aperture such that the sensor is not optically obstructed by the display panel.

Example 3: The computing device of any of examples 1 and 2, wherein a shape of the aperture is oblong.

Example 4: The computing device of any of examples 2 and 3, wherein a shape of the aperture is a rectangle.

Example 5: The computing device of example 4, wherein one or more corners of the aperture are rounded.

Example 6: The computing device of any of examples 1 through 5, wherein a shape of the aperture is one of an ellipse or a discorectangle.

Example 7: The computing device of any of examples 1 through 6, wherein the processing circuitry includes first processing circuitry, the computing device further includes second processing circuitry configured to control operation of the first processing circuitry such that pixels of the matrix of pixels surrounding the aperture are selectively deactivated to modify an appearance of a shape of the aperture.

Example 8: The computing device of any of examples 6 and 7, wherein the first processing circuitry includes a display driver integrated circuit (DDIC), and wherein the second processing circuitry includes one or both of a central processing unit (CPU) or a graphical processing unit (GPU).

Example 9: The computing device of any of examples 1 through 8, wherein the display includes an organic light emitting diode display (OLED) configured to allow the sensor to operate through the OLED display via omission of back cover material from an area of a back cover of the OLED display above the sensor.

Example 10: The computing device of any of examples 1 through 9, wherein the sensor is an electronic image sensor, and wherein an aspect ratio of the sensor is one of 4:3, 3:2, or 1.85:1.

Example 11: A method includes displaying, at a display panel of a computing device and at a first time, a first image, wherein the display panel has a first end and a second end, wherein the display panel includes a matrix of pixels and defines an aperture surrounded by pixels of the matrix of pixels but that does not include pixels of the matrix of pixels, and wherein a length of a physical shape of the aperture parallel to an axis connecting the first end and the second end is greater than a length of the physical shape of the aperture perpendicular to the axis; displaying, at the display panel and at a second time that is different than the first time, a second image resulting the physical shape of the aperture having a modified apparent shape that is different than the physical shape; and capturing, via a sensor that senses light that passes through the aperture, an image.

Example 12: The method of example 11, wherein displaying the second image includes: deactivating pixels of the matrix of pixels proximate to the aperture such that the physical shape of the aperture has the modified apparent shape.

Example 13: The method of any of examples 11 and 12, wherein a length of the modified apparent shape of the aperture parallel to the axis connecting the first end and the second end is not greater than a length of the modified apparent shape of the aperture perpendicular to the axis.

Example 14: The method of any of examples 11 through 13, wherein the modified apparent shape of the aperture is one of a circle, a discorectangle, an ellipse, or a rectangle.

Example 15: The method of any of examples 11 through 14, wherein displaying the second image includes cross fading to the second image from the first image such that the appearance of the aperture visibly transitions from the physical shape to the modified apparent shape.

Example 16: The method of any of examples 11 through 15, further includes controlling, by a display driver integrated circuit (DDIC) positioned proximate to the second end, operation of pixels of the matrix of pixels.

Example 17: The method of any of examples 11 through 16, wherein the display panel includes an organic light emitting diode display (OLED) configured to allow the sensor to sense light through the OLED display via omission of back cover material from an area of a back cover of the OLED display above the sensor.

Example 18: The method of any of examples 11 through 17, wherein the sensor is an electronic image sensor, and wherein an aspect ratio of the sensor is one of 4:3, 3:2, or 1.85:1.

Example 19: A computer-readable storage medium storing instructions that, when executed, cause processing circuitry of a computing device to: display, at a display panel of the computing device and at a first time, a first image, wherein the display panel has a first end and a second end, wherein the display panel includes a matrix of pixels and defines an aperture surrounded by pixels of the matrix of pixels but that does not include pixels of the matrix of pixels, and wherein a length of a physical shape of the aperture parallel to an axis connecting the first end and the second end is greater than a length of the physical shape of the aperture perpendicular to the axis; display, at the display panel and at a second time that is different than the first time, a second image resulting the physical shape of the aperture having a modified apparent shape that is different than the physical shape; and capture, via a sensor that senses light that passes through the aperture, an image.

Example 20: The computer-readable storage medium of example 19, wherein the instructions that cause the processing circuitry to display the second image include instructions that cause the processing circuitry to: deactivate pixels of the matrix of pixels proximate to the aperture such that the physical shape of the aperture has the modified apparent shape, wherein a length of the modified apparent shape of the aperture parallel to the axis connecting the first end and the second end is not greater than a length of the modified apparent shape of the aperture perpendicular to the axis. The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A method comprising:
    displaying, at a display panel of a computing device and at a first time, a first image, wherein the display panel has a first end and a second end, wherein the display panel includes a matrix of pixels and defines an aperture surrounded by pixels of the matrix of pixels but that does not include pixels of the matrix of pixels, and wherein a length of a physical shape of the aperture parallel to an axis connecting the first end and the second end is greater than a length of the physical shape of the aperture perpendicular to the axis;
    displaying, at the display panel and at a second time that is different than the first time, a second image resulting the physical shape of the aperture having a modified apparent shape that is different than the physical shape; and
    capturing, via a sensor that senses light that passes through the aperture, an image.

2. The method of claim 1, wherein displaying the second image comprises: deactivating pixels of the matrix of pixels proximate to the aperture such that the physical shape of the aperture has the modified apparent shape.

3. The method of claim 1, wherein a length of the modified apparent shape of the aperture parallel to the axis connecting the first end and the second end is not greater than a length of the modified apparent shape of the aperture perpendicular to the axis.

4. The method of claim 1, wherein the modified apparent shape of the aperture is one of a circle, a discorectangle, an ellipse, or a rectangle.

5. The method of claim 1, wherein displaying the second image comprises cross fading to the second image from the first image such that the appearance of the aperture visibly transitions from the physical shape to the modified apparent shape.

6. The method of claim 1, further comprising:
    controlling, by a display driver integrated circuit (DDIC) positioned proximate to the second end, operation of pixels of the matrix of pixels.

7. The method of claim 1, wherein the display panel comprises an organic light emitting diode display (OLED) configured to allow the sensor to sense light through the OLED display via omission of back cover material from an area of a back cover of the OLED display above the sensor.

8. The method of claim 1, wherein the sensor is an electronic image sensor, and wherein an aspect ratio of the sensor is one of 4:3, 3:2, or 1.85:1.

9. A computer-readable storage medium storing instructions that, when executed, cause processing circuitry of a computing device to:
    display, at a display panel of the computing device and at a first time, a first image, wherein the display panel has a first end and a second end, wherein the display panel includes a matrix of pixels and defines an aperture surrounded by pixels of the matrix of pixels but that does not include pixels of the matrix of pixels, and wherein a length of a physical shape of the aperture parallel to an axis connecting the first end and the second end is greater than a length of the physical shape of the aperture perpendicular to the axis;
    display, at the display panel and at a second time that is different than the first time, a second image resulting the physical shape of the aperture having a modified apparent shape that is different than the physical shape; and
    capture, via a sensor that senses light that passes through the aperture, an image.

10. The computer-readable storage medium of claim 9, wherein the instructions that cause the processing circuitry to display the second image comprise instructions that cause the processing circuitry to:
    deactivate pixels of the matrix of pixels proximate to the aperture such that the physical shape of the aperture has the modified apparent shape, wherein a length of the modified apparent shape of the aperture parallel to the axis connecting the first end and the second end is not greater than a length of the modified apparent shape of the aperture perpendicular to the axis.

* * * * *